US012628372B2

(12) United States Patent
Yu et al.

(10) Patent No.: US 12,628,372 B2
(45) Date of Patent: *May 12, 2026

(54) CAPACITANCE REDUCTION FOR BACKSIDE POWER RAIL DEVICE

(71) Applicant: Taiwan Semiconductor Manufacturing Company, Ltd., Hsinchu (TW)

(72) Inventors: Li-Zhen Yu, New Taipei (TW); Lin-Yu Huang, Hsinchu (TW); Cheng-Chi Chuang, New Taipei (TW); Chih-Hao Wang, Baoshan Township (TW); Huan-Chieh Su, Tianzhong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,682

(22) Filed: Jan. 4, 2024

(65) Prior Publication Data

US 2024/0145562 A1 May 2, 2024

Related U.S. Application Data

(63) Continuation of application No. 17/814,098, filed on Jul. 21, 2022, now Pat. No. 11,901,423, which is a continuation of application No. 17/069,344, filed on Oct. 13, 2020, now Pat. No. 11,404,548.

(51) Int. Cl.
*H10D 30/62* (2025.01)

(52) U.S. Cl.
CPC .............................. *H10D 30/6219* (2025.01)

(58) Field of Classification Search
CPC ............ H01L 21/7682; H01L 29/0653; H01L 29/7848; H01L 29/41791; H01L 29/401; H01L 29/66795; H01L 29/7853; H01L 29/0847; H01L 21/76897; H10D 30/6219; H10D 30/6735
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,305,835 B2 * | 4/2016 | Alptekin .............. H10D 64/015 |
| 9,406,804 B2 | 8/2016 | Huang et al. |

(Continued)

*Primary Examiner* — Changhyun Yi

(74) *Attorney, Agent, or Firm* — Sterne, Kessler, Goldstein & Fox P.L.L.C.

(57) ABSTRACT

The present disclosure describes a method to form a backside power rail (BPR) semiconductor device with an air gap. The method includes forming a fin structure on a first side of a substrate, forming a source/drain (S/D) region adjacent to the fin structure, forming a first S/D contact structure on the first side of the substrate and in contact with the S/D region, and forming a capping structure on the first S/D contact structure. The method further includes removing a portion of the first S/D contact structure through the capping structure to form an air gap and forming a second S/D contact structure on a second side of the substrate and in contact with the S/D region. The second side is opposite to the first side.

20 Claims, 10 Drawing Sheets

(56) References Cited

U.S. PATENT DOCUMENTS

| | | | |
|---|---|---|---|
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,872,820 B2 | 12/2020 | Block et al. | |
| 11,404,548 B2 | 8/2022 | Yu et al. | |
| 11,901,423 B2 * | 2/2024 | Yu | H01L 29/42392 |
| 2012/0104512 A1 * | 5/2012 | Horak | H01L 29/6653 |
| | | | 257/E21.409 |
| 2015/0243544 A1 * | 8/2015 | Alptekin | H01L 21/7682 |
| | | | 438/586 |
| 2021/0050412 A1 * | 2/2021 | Wong | H10D 30/60 |
| 2021/0066489 A1 * | 3/2021 | Xie | H10D 30/6219 |
| 2022/0359685 A1 | 11/2022 | Yu et al. | |

* cited by examiner

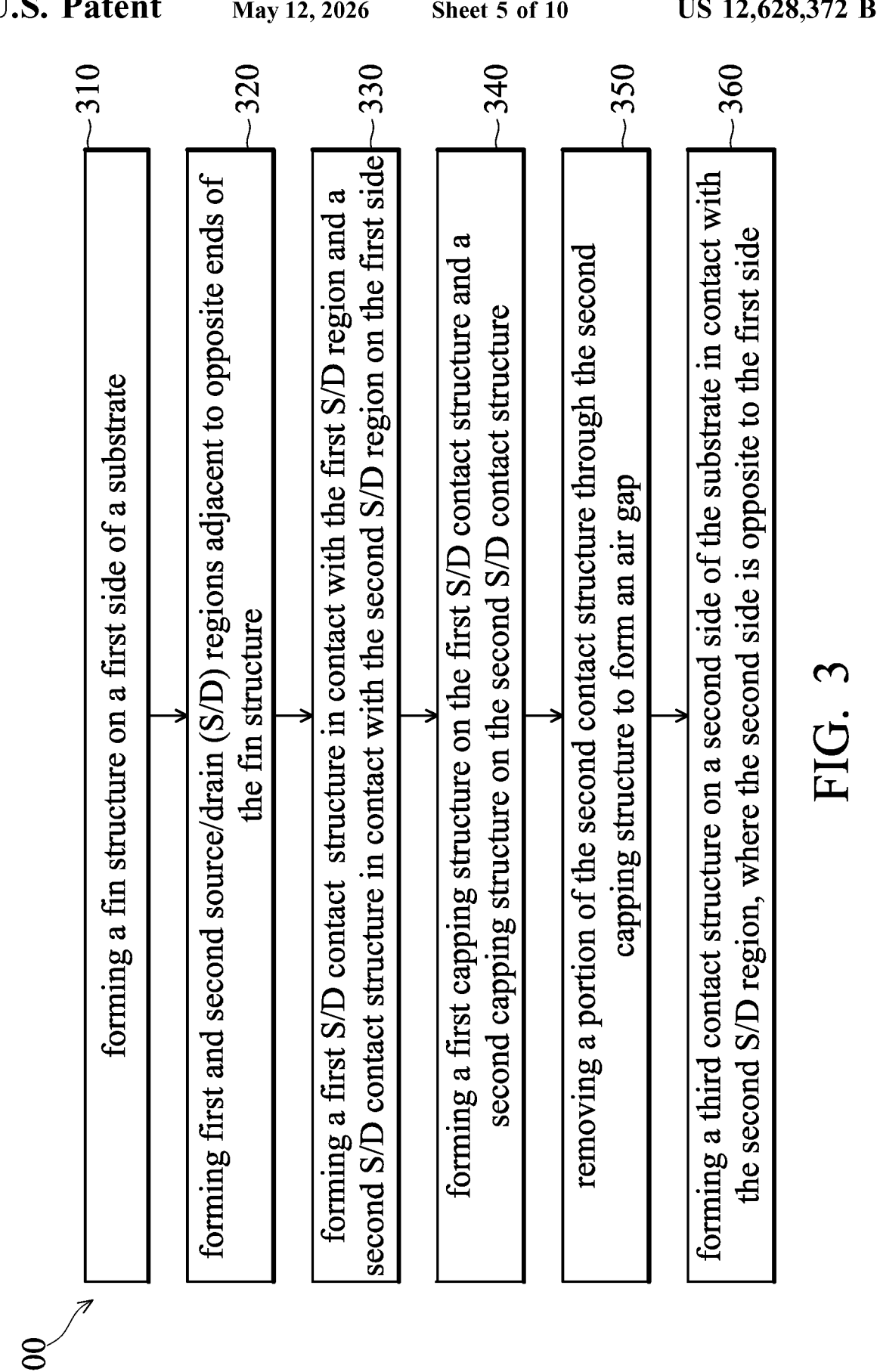

300

310 — forming a fin structure on a first side of a substrate

320 — forming first and second source/drain (S/D) regions adjacent to opposite ends of the fin structure 330 — forming a first S/D contact structure in contact with the first S/D region and a second S/D contact structure in contact with the second S/D region on the first side 340 — forming a first capping structure on the first S/D contact structure and a second capping structure on the second S/D contact structure 350 — removing a portion of the second contact structure through the second capping structure to form an air gap 360 — forming a third contact structure on a second side of the substrate in contact with the second S/D region, where the second side is opposite to the first side

FIG. 3

CAPACITANCE REDUCTION FOR BACKSIDE POWER RAIL DEVICE

CROSS-REFERENCE TO RELATED APPLICATION

This application is a continuation of U.S. Non-Provisional patent application Ser. No. 17/814,098, filed on Jul. 21, 2022, titled "Capacitance Reduction for Backside Power Rail Device," which is a continuation of U.S. Non-Provisional patent application Ser. No. 17/069,344, filed on Oct. 13, 2020, titled "Capacitance Reduction for Backside Power Rail Device," now U.S. Pat. No. 11,404,548, the disclosures of which are incorporated by reference herein in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIG. 3 is a flow diagram of a method for fabricating a BPR semiconductor device with capacitance reduction using an air gap, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figures 1A, 1B:
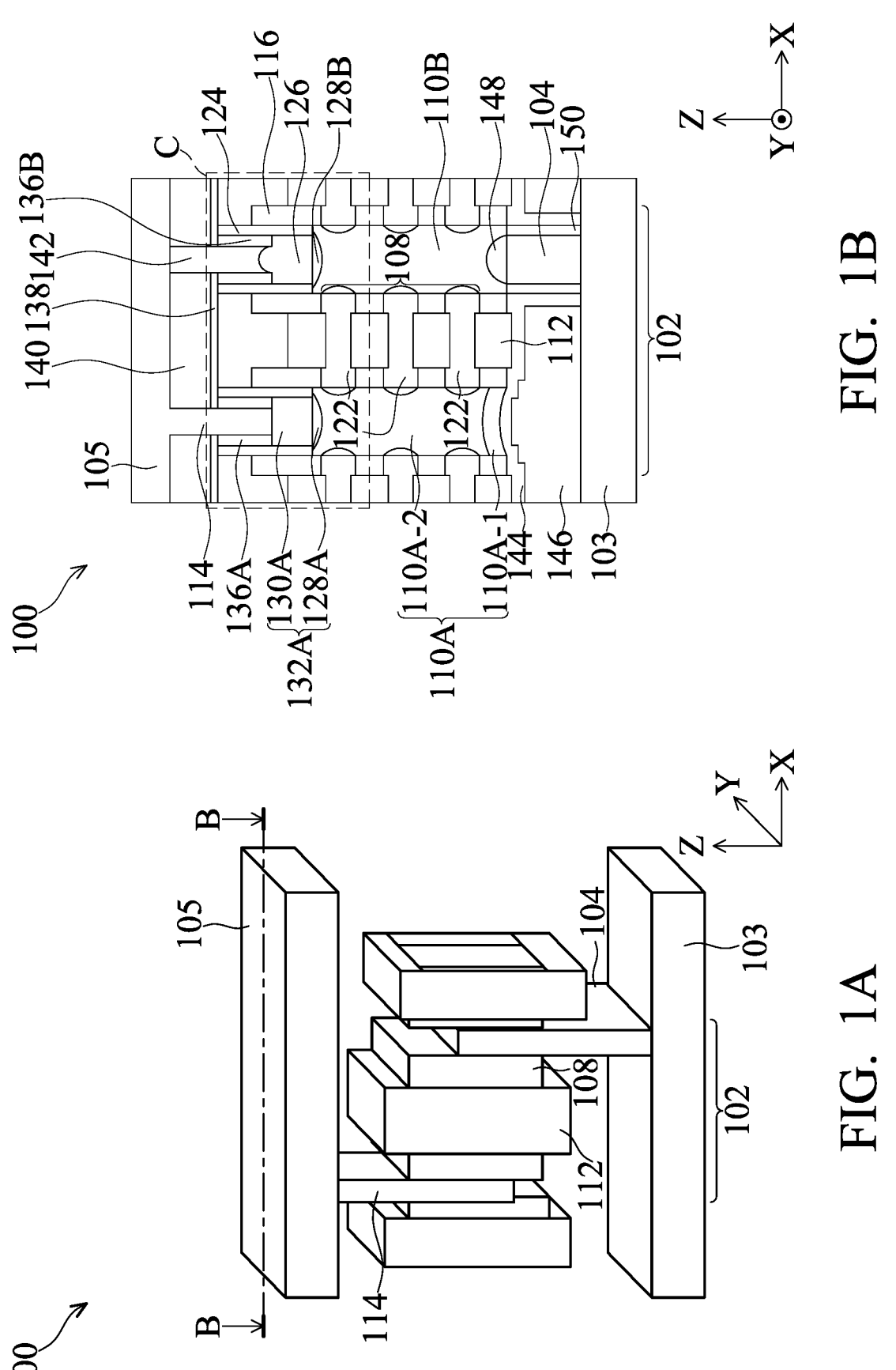
FIGS. 1A, 1B, and 1C illustrate an isometric view and various cross-sectional views of a backside power rail (BPR) semiconductor device with capacitance reduction using an air gap, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact.

As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller area (collectively referred to as "PPA") of semiconductor devices, backside power rails (BPR) can be implemented in semiconductor devices to reduce the device area and the metal interconnect length, thus reducing parasitic capacitances and parasitic resistances and improving device performance. For example, backside power rails can improve performance of power delivery networks (PDNs) for advanced technology nodes. BPR semiconductor devices can have front-side S/D contact structures and interconnect structures at the front-side and backside S/D contact structures and interconnect structures at the backside to reduce device area, parasitic capacitance and resistance, and improve device performance. For example, front-side S/D contact structures and interconnect structures can connect a drain region of a BPR semiconductor device to front-side power rails. Backside S/D contact structures and interconnect structures can connect a source region of the BPR semiconductor device to backside power rails. The source region of the BPR semiconductor device can be connected to a dummy front-side S/D contact structure though it's connected to backside S/D contact structures. The dummy front-side S/D contact structure is not connected to front-side interconnect structures or front-side power rails, but it can introduce parasitic capacitance between the gate structure and the dummy front-side S/D contact structure of the BPR semiconductor device. The parasitic capacitance can degrade the device performance of the BPR semiconductor device.

Various embodiments in the present disclosure provide methods for forming a BPR semiconductor device with capacitance reduction using an air gap. According to some embodiments, the BPR semiconductor device can have first and second S/D regions adjacent to opposite ends of a fin structure on a front side of a substrate. First and second S/D contact structures each having a metal contact and a silicide layer can be formed in contact with the first and second S/D regions, respectively. The first S/D contact structure can be connected to front-side power rails by a first interconnect structure through a first capping structure on the first S/D contact structure. The second S/D contact structure can be removed through an opening in a second capping structure over the second S/D region. After removal of the second S/D contact structure, an air gap can form between the second capping structure and the second S/D region. In some embodiments, the metal contact of the second S/D contact structure can be removed through the opening. In some embodiments, both the metal contact and the silicide layer of the second S/D contact structure can be removed through the opening. In some embodiments, a seal dielectric structure can be formed in the opening to seal the air gap between the second capping structure and the second S/D region. In some embodiments, a seal dielectric layer can be formed in the air gap during the formation of the seal dielectric structure in the opening. According to some embodiments, the air gap can reduce the parasitic capacitance between the second S/D region and gate structures of the BPR semiconductor device. In some embodiments, the device performance of the BPR semiconductor device can be improved by about 3% to about 5.5% due to capacitance reduction using the air gap.

Figure 1C:
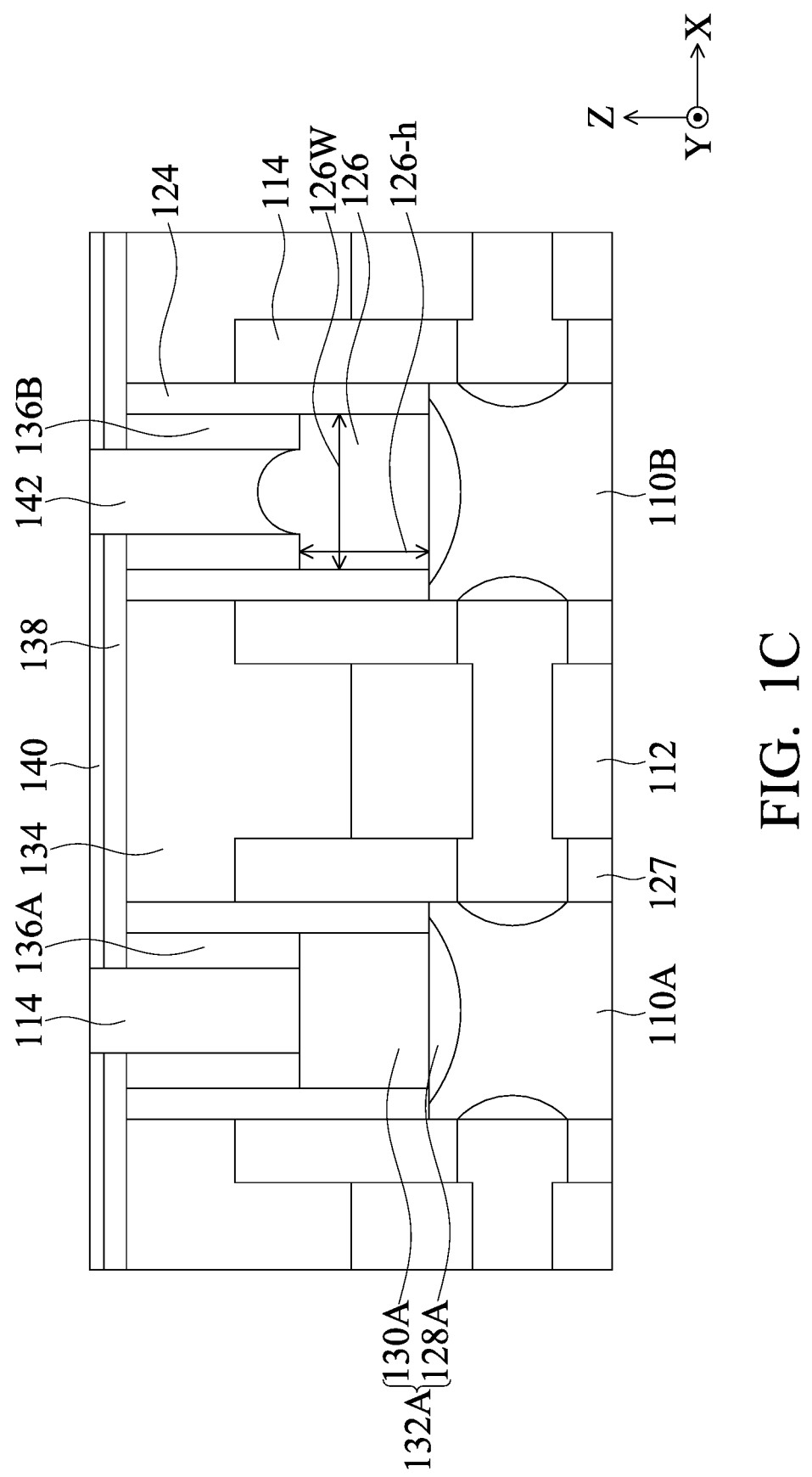

FIG. 1A illustrates an isometric view of a BPR semiconductor device 100 with capacitance reduction using an air gap 126, in accordance with some embodiments. BPR semiconductor device 100 can include a FET 102. A first interconnect structure 114 (also referred to as "front-side interconnect structure 114") can connect a first S/D region of FET 102 to front-side power rails 105. A second interconnect structure 104 (also referred to as "backside interconnect structure 104") can connect a second S/D region of FET 102 to backside power rails 103. FIG. 1B illustrates a cross-sectional view of BPR semiconductor device 100 along line B-B in FIG. 1A, in accordance with some embodiments. FIG. 1C illustrates an enlarged view of region C in FIG. 1B, according to some embodiments. In some embodiments, FIGS. 1A-1C show a portion of an IC layout where the fin structures and the gate structures can be similar or different from the one shown in FIGS. 1A-1C.

Referring to FIGS. 1A-1C, BPR semiconductor device 100 can include FET 102, front-side and backside interconnect structures 114 and 104 connected to front-side power rails 105 and backside power rails 103, respectively. FET 102 can further include a fin structure 108, first and second S/D regions 110A and 110B, gate structures 112, gate spacers 116, and inner spacer structures 127.

In some embodiments, FET 102 can be a p-type finFET (PFET) or an n-type finFET (NFET). The term "p-type" can be associated with a structure, layer, and/or region doped with p-type dopants, such as boron. The term "n-type" can be associated with a structure, layer, and/or region doped with n-type dopants, such as phosphorus. Though FIGS.

1A-1C show one finFET, BPR semiconductor device 100 can have any number of finFETs. In addition, BPR semiconductor device 100 can be incorporated into an integrated circuit through the use of other structural components, such as conductive vias, conductive lines, dielectric layers, and passivation layers, that are not shown for simplicity.

FET 102 can be formed on a first side (e.g., front-side) of substrate 406, as shown in FIGS. 4-10. In some embodiments, substrate 406 can include a semiconductor material, such as silicon (Si). In some embodiments, substrate 406 can include a silicon-on-insulator (SOI) substrate (e.g., SOI wafer). In some embodiments, substrate 406 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon germanium (SiGe)-on insulator structure (SiGeOI); (v) germanium-on-insulator (GeOI) structure; or (vi) a combination thereof. Further, substrate 406 can be doped depending on design requirements (e.g., p-type substrate or n-type substrate). In some embodiments, substrate 406 can be doped with p-type dopants (e.g., boron, indium, aluminum, or gallium) or n-type dopants (e.g., phosphorus or arsenic).

As shown in FIG. 1B, BPR semiconductor device 100 can include fin structure 108 extending along an X-axis and through FET 102. Fin structure 108 can include a stack of semiconductor layers 122, which can be nanosheets or nanowires. Each of semiconductor layers 122 can form a channel region underlying gate structures 112 of FET 102. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

In some embodiments, semiconductor layers 122 can include semiconductor materials similar to or different from substrate 406. In some embodiments, each of semiconductor layers 122 can include Si without any substantial amount of or can include silicon germanium (SiGe) with Ge in a range from about 5 atomic percent to about 50 atomic percent Ge with any remaining atomic percent being Si. The semiconductor materials of semiconductor layers 122 can be undoped or can be in-situ doped during its epitaxial growth process using: (i) p-type dopants, such as boron, indium, and gallium; and/or (ii) n-type dopants, such as phosphorus and arsenic. Though three layers of semiconductor layers 122 for FET 102 are shown in FIG. 1B, FET 102 can have any number of semiconductor layers 122.

Referring to FIGS. 1A-1C, first and second S/D regions 110A and 110B can be disposed adjacent to opposite ends of fin structure 108. In some embodiments, first and second S/D regions 110A and 110B can have any geometric shape, such as a polygon, an ellipsis, and a circle. First and second S/D regions 110A and 110B can include an epitaxially-grown semiconductor material. In some embodiments, the epitaxially-grown semiconductor material is the same material as substrate 406. In some embodiments, the epitaxially-grown semiconductor material includes a different material from substrate 406. In some embodiments, the epitaxially-grown semiconductor material for first and second S/D regions 110A and 110B can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, first and second S/D regions 110A and 110B can be n-type or p-type. In some embodiments, n-type first and second S/D regions 110A and 110B can include Si and can be in-situ doped during an epitaxial growth process using n-type dopants, such as phosphorus and arsenic. In some embodiments, n-type first and second S/D regions 110A and 110B can have multiple n-type epitaxial fin sub-regions that can differ from each other based on, for example, doping concentration and/or epitaxial growth process conditions. In some embodiments, p-type first and second S/D regions 110A and 110B can include SiGe and can be in-situ doped during an epitaxial growth process using p-type dopants, such as boron, indium, and gallium. In some embodiments, p-type first and second S/D regions 110A and 110B can have multiple sub-regions that can include SiGe and can differ from each other based on, for example, doping concentration, epitaxial growth process conditions, and/or relative concentration of Ge with respect to Si. For example, as shown in FIG. 1B, first S/D region 110A can include first epitaxial sub-region 110A-1 and second epitaxial sub-region 110A-2. In some embodiments, first epitaxial sub-region 110A-1 can have a width along an X-axis ranging from about 10 nm to about 30 nm and a thickness along a Z-axis ranging from about 5 nm to about 10 nm. In some embodiments, second epitaxial sub-region 110A-2 can have a width along an X-axis ranging from about 10 nm to about 30 nm and a thickness along a Z-axis ranging from about 30 nm to about 50 nm.

Referring to FIGS. 1A and 1B, fin structure 108 can be current-carrying structures for FET 102. Channel regions of FET 102 can be formed in portions of their respective fin structure 108 underlying gate structures 112. First and second S/D regions 110A and 110B can function as source/drain regions of FET 102.

Referring to FIGS. 1A-1C, gate structures 112 can be multi-layered structures and can be wrapped around semiconductor layers 122 of fin structure 108. In some embodiments, each of semiconductor layers 122 of fin structure 108 can be wrapped around by one or more layers of gate structures 112, respectively, and gate structures 112 can be referred to as "gate-all-around (GAA) structures" and FET 102 can be referred to as "GAA FET" or "GAA finFET."

Gate structures 112 can include a gate dielectric layer and a gate electrode wrapped around semiconductor layers 122. The gate dielectric layer can be wrapped around each of semiconductor layers 122, and thus electrically isolate semiconductor layers 122 from each other and from the conductive gate electrode to prevent shorting between gate structures 112 and semiconductor layers 122 during operation of FET 102. In some embodiments, the gate dielectric layer can include an interfacial layer and a high-k layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, the interfacial layer can include silicon oxide. In some embodiments, the high-k layer can include hafnium oxide ($HfO_2$), zirconium oxide ($ZrO_2$), or any suitable high-k dielectric materials. In some embodiments, the gate electrode can include a gate barrier layer, a gate work function layer, and a gate metal fill layer. Each of semiconductor layers 122 can be wrapped around by one or more of the gate barrier layer, the gate work function layer, and the gate metal fill layer. In some embodiments, the gate electrode can include titanium (Ti), tantalum (Ta), titanium nitride (TiN), tantalum nitride (TaN), aluminum (Al), copper (Cu), tungsten (W), cobalt (Co), or other suitable conductive materials.

Referring to FIGS. 1B and 1C, gate spacers 116 can be disposed along sidewalls of gate structures 112, and inner spacer structures 127 can be disposed between portions of gate structures 112 and first and second S/D regions 110A and 110B. Each of gate spacers 116 and inner spacer structures 127 can include a dielectric material, such as silicon oxide ($SiO_x$), silicon oxynitride ($SiO_yN$), silicon nitride ($SiN_x$), silicon oxycarbide (SiOC), silicon carbonitride (SiCN), silicon oxynitricarbide (SiOCN), and a combination thereof. In some embodiments, each of gate spacers 116 and inner spacer structures 127 can include a single layer or multiple layers of insulating materials. In some embodiments, gate spacers 116 can isolate gate structures 112 and adjacent S/D contact structures. Inner spacer structures 127 can isolate gate structures 112 and first and second S/D regions 110A and 110B.

Referring to FIGS. 1A-1C, BPR semiconductor device 100 can further include a front-side S/D contact structure 132A, a dummy silicide layer 128B, an air gap 126, a first etch stop layer (ESL) 124, a gate capping structure 134, first and second capping structures 136A and 136B, a seal dielectric structure 142, front-side interconnect structure 114, a second ESL 138, a front-side interlayer dielectric (ILD) layer 140, a liner 144, a backside ILD layer 146, a backside contact structure 148, a barrier layer 150, and backside interconnect structure 104. As shown in FIGS. 1A-1C, front-side S/D contact structure 132A and front-side interconnect structure 114 can connect first S/D region 110A to front-side power rails 105. Backside contact structure 148 and backside interconnect structure 104 can connect second S/D region 110B to backside power rails 103. In some embodiments, front-side power rails 105 and backside power rails can include power supply lines and ground lines for BPR semiconductor device 100.

Front-side S/D contact structure 132A can include a silicide layer 128A and a metal contact 130A. Silicide layer 128A can include metal silicides and can reduce the contact resistance between metal contact 130A and first S/D region 110A of FET 102. Examples of metals used for forming the metal silicides on n-type S/D regions can include titanium (Ti), chromium (Cr), tantalum (Ta), molybdenum (Mo), zirconium (Zr), hafnium (Hf), scandium (Sc), yttrium (Y), holmium (Ho), terbium (Tb), gadolinium (Gd), lutetium (Lu), dysprosium (Dy), erbium (Er), ytterbium (Yb), and other suitable metals. Examples of metals used for forming the metal silicides on p-type S/D regions can include nickel (Ni), cobalt (Co), manganese (Mn), tungsten (W), iron (Fe), rhodium (Rh), palladium (Pd), ruthenium (Ru), platinum (Pt), iridium (Ir), osmium (Os), and other suitable metals. In some embodiments, silicide layer 128A can have a thickness along a Z-axis ranging from about 1 nm to about 10 nm. In some embodiments, dummy silicide layer 128B can include a same metal silicide as silicide layer 128A and can have a thickness ranging from about 1 nm to about 10 nm.

Metal contact 130A can include metals, such as tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), metal alloys, or other suitable metals. In some embodiments, metal contact 130A can have a thickness along a Z-axis ranging from about 10 nm to about 50 nm.

As shown in FIGS. 1B and 1C, air gap 126 can be disposed between second capping structure 136B and second S/D region 110B. Air gap 126 can be formed by removing the dummy metal contact on second S/D region 110B and can be filled with air. According to some embodiments, air gap 126, which replaces the metal contact, can reduce an overlapping area between gate structures 112 and second S/D region 110B, and thus reduce the parasitic capacitance between gate structures 112 and second S/D region 110B. The capacitance reduction using the air gap can improve the device performance of BPR semiconductor device 100 by about 3% to about 5.5%. In some embodiments, air gap 126 can have a horizontal dimension 126$w$ (e.g., width) along an X-axis ranging from about 5 nm to about 30 nm. Air gap 126 can have a vertical dimension 126$h$ (e.g., height) along a Z-axis ranging from about 5 nm to about 50 nm. In some embodiments, a ratio between vertical dimension 126$h$ to horizontal dimension 126$w$ can range from about 0.1 to about 10. If vertical dimension 126$h$ is less than about 5 nm, or the ratio is less than about 0.1, the device performance of BPR semiconductor device 100 may not be improved. If vertical dimension 126$h$ is greater than about 50 nm, or the ratio is greater than about 10, air gap 126 may not be properly sealed. In addition, horizontal dimension 126$w$ can be limited by a distance between adjacent gate structures, and vertical dimension 126$h$ can be limited by surrounding structures.

Gate capping structure 134 can be disposed on gate structures 112 and configured to protect underlying structures and/or layers during processing of BPR semiconductor device 100. For example, gate capping structure 134 can act as an etch stop layer during the formation of front-side S/D contact structures on first and second S/D regions 110A and 110B. Gate capping structure 134 can include one or more insulating materials. In some embodiments, the insulating materials can include silicon oxide (SiO$_x$), hafnium silicide (HfSi), silicon oxycarbide (SiOC), aluminum oxide (AlO$_x$), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN$_x$), silicon oxynitricarbide (SiOCN), silicon (Si), zirconium nitride (ZrN), silicon carbonitride (SiCN), or other suitable materials. In some embodiments, gate capping structure 134 can have a thickness along a Z-axis ranging from about 0 nm to about 50 nm. In some embodiments, gate capping structure 134 can have a width along an X-axis ranging from about 5 nm to about 30 nm. In some embodiments, BPR semiconductor device 100 can have no gate capping structure.

First capping structure 136A can be disposed on front-side S/D contact structure 132A and second capping structure 136B can be disposed above air gap 126. First and second capping structures 136A and 136B can be configured to protect adjacent structures (e.g., gate structures 112) during the formation of front-side interconnect structure 114 and formation of seal dielectric structure 142. In some embodiments, first and second capping structures 136A and 136B can include insulating materials, such as silicon oxide (SiO$_x$), silicon oxycarbide (SiOC), aluminum oxide (AlO$_x$), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN$_x$), silicon oxynitricarbide (SiOCN), zirconium nitride (ZrN), silicon carbonitride (SiCN), and other suitable materials. In some embodiments, first and second capping structures 136A and 136B can include same insulating materials. In some embodiments, gate capping structure 134 can include insulating materials different from first and second capping structures 136A and 136B, which can have different etch selectivity and to further protect adjacent structures (e.g., gate structures 112). The term "etch selectivity" can refer to the ratio of the etch rates of two different materials under the same etching conditions. In some embodiments, the etch selectivity between gate capping structure 134 and first and second capping structures 136A and 136B can range from about 15 to about 20. For example, gate capping structure 134 can include silicon nitride, and first and second capping structures 136A and 136B can include silicon oxide. In some embodiments, first and second capping structures 136A and 136B can have a thickness along a Z-axis ranging from about 0 nm to about 50 nm and a width along an X-axis ranging from about 5 nm to about 30 nm. In some embodiments, BPR semiconductor device 100 can have no capping structures on front-side S/D contact structure 132A.

Referring to FIGS. 1A-1C, front-side interconnect structure 114 can connect to front-side S/D contact structure 132A and extends through first capping structure 136A, second etch stop layer (ESL) 138, and front-side ILD layer 140. Front-side interconnect structure 114 can include metals, such as tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), metal alloys, and other suitable metals. In some embodiments, front-side interconnect structure 114 can have a thickness along a Z-axis ranging from about 1 nm to about 50 nm.

Seal dielectric structure 142 can extend through second capping structure 136B, second ESL 138, and front-side ILD layer 140 to seal air gap 126. Seal dielectric structure 142 can include insulating materials, such as silicon oxide (SiO$_x$), silicon oxycarbide (SiOC), aluminum oxide (AlO$_x$), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN$_x$), silicon oxynitricarbide (SiOCN), zirconium nitride (ZrN), silicon carbonitride (SiCN), and other suitable materials. In some embodiments, seal dielectric structure 142 can have a thickness along a Z-axis ranging from about 10 nm to about 50 nm and a width along an X-axis ranging from about 5 nm to about 30 nm. In some embodiments, a ratio of the width of seal dielectric structure 142 to the width of second capping structure 136B can range from about 0.3 to about 0.6. If the width of seal dielectric structure 142 is less than about 5 nm, or the ratio is less than about 0.3, the metal contact on second S/D region 110B may not be removed and air gap 126 and seal dielectric structure 142 may not be formed. If the width of seal dielectric structure 142 is greater than about 15 nm, or the ratio is greater than about 0.6, seal dielectric structure 142 may not seal air gap 126 and may fill in air gap 126. In some embodiments, seal dielectric structure 142 can have a concave surface adjacent to air gap 126. The concave surface can be a round surface or a triangular surface formed due to the deposition process of seal dielectric structure 142.

First ESL 124 can be formed on sidewalls of gate spacers 116 and on first and second S/D regions 110A and 110B. First ESL 124 can protect gate structure 112 and/or portions of first and second S/D regions 110A and 110B that are not in contact with front-side S/D contact structure 132A. This protection can be provided, for example, during formation of front-side S/D contact structure 132A. In some embodiments, first ESL 124 can include, for example, silicon nitride ($SiN_x$), silicon oxide ($SiO_x$), silicon oxynitride (SiON), silicon carbide (SiC), or a combination thereof. Second ESL 138 can be formed on gate capping structure 134 and first and second capping structures 136A and 136B. In some embodiments, second ESL 138 can include dielectric materials, such as aluminum oxide, to protect underlying structures during the formation of front-side interconnect structures.

Front-side ILD layer 140 can be disposed on first ESL 124. Front-side ILD layer 140 can include a dielectric material to isolate front-side interconnect structure 114 and other interconnect structures. The dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide. In some embodiments, front-side ILD layer 140 can have a thickness along a Z-axis ranging from about 10 nm to about 25 nm. Backside ILD layer 146 can be disposed on another side (e.g., backside) of fin structure 108 opposite to front-side S/D contact structure 132A. Backside ILD layer 146 can include a similar dielectric material to front-side ILD layer 140 and can provide isolation between backside interconnect structure 104 and other backside interconnect structures.

Liner 144 can be disposed between backside ILD layer 146 and first and second S/D regions 110A and 110B. In some embodiments, liner 144 can provide protection to gate structures 112 and first and second S/D regions 110A and 110B during the formation of backside ILD layer 146. Backside contact structure 148 can include a silicide layer similar to or different from silicide layers 128A and 128B. In some embodiments, backside contact structure 148 can reduce the contact resistance between backside interconnect structure 104 and second S/D region 110B. Barrier layer 150 can be disposed between backside interconnect structure 104 and liner 144. In some embodiments, barrier layer 150 can prevent diffusion of metals from backside interconnect structure 104 to backside ILD layer 146.

In some embodiments, BPR semiconductor device 100 can further include other structures, such as metal lines, metal vias, and dielectric structures, to provide connection to and isolation from other parts of the IC layout. These structures are not shown in details merely for clarity and ease of description.

Figures 2A, 2B:
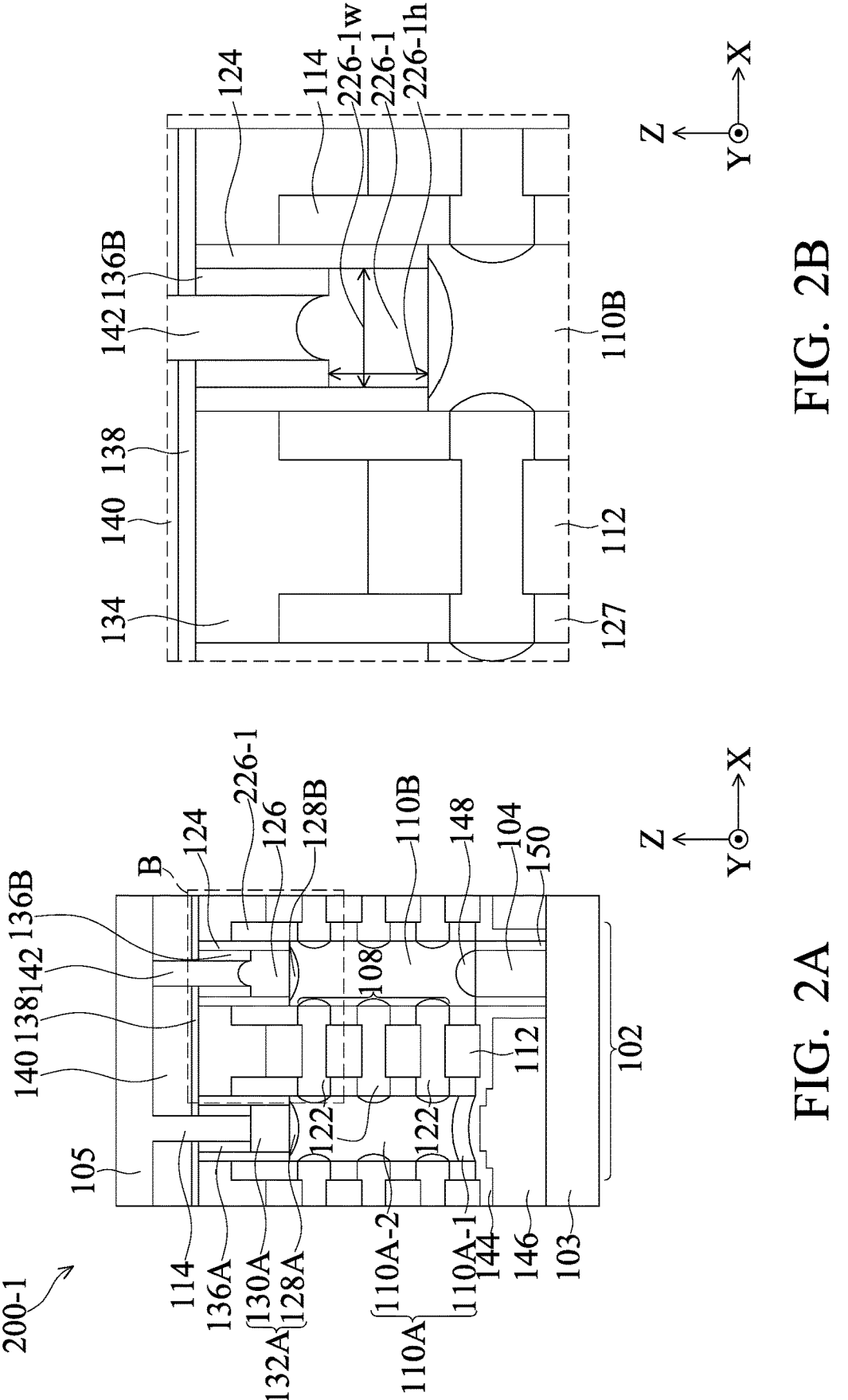
FIGS. 2A, 2B, 2C, and 2D illustrate cross-sectional views of various BPR semiconductor devices with capacitance reduction using an air gap, in accordance with some embodiments.
Figures 2C, 2D:
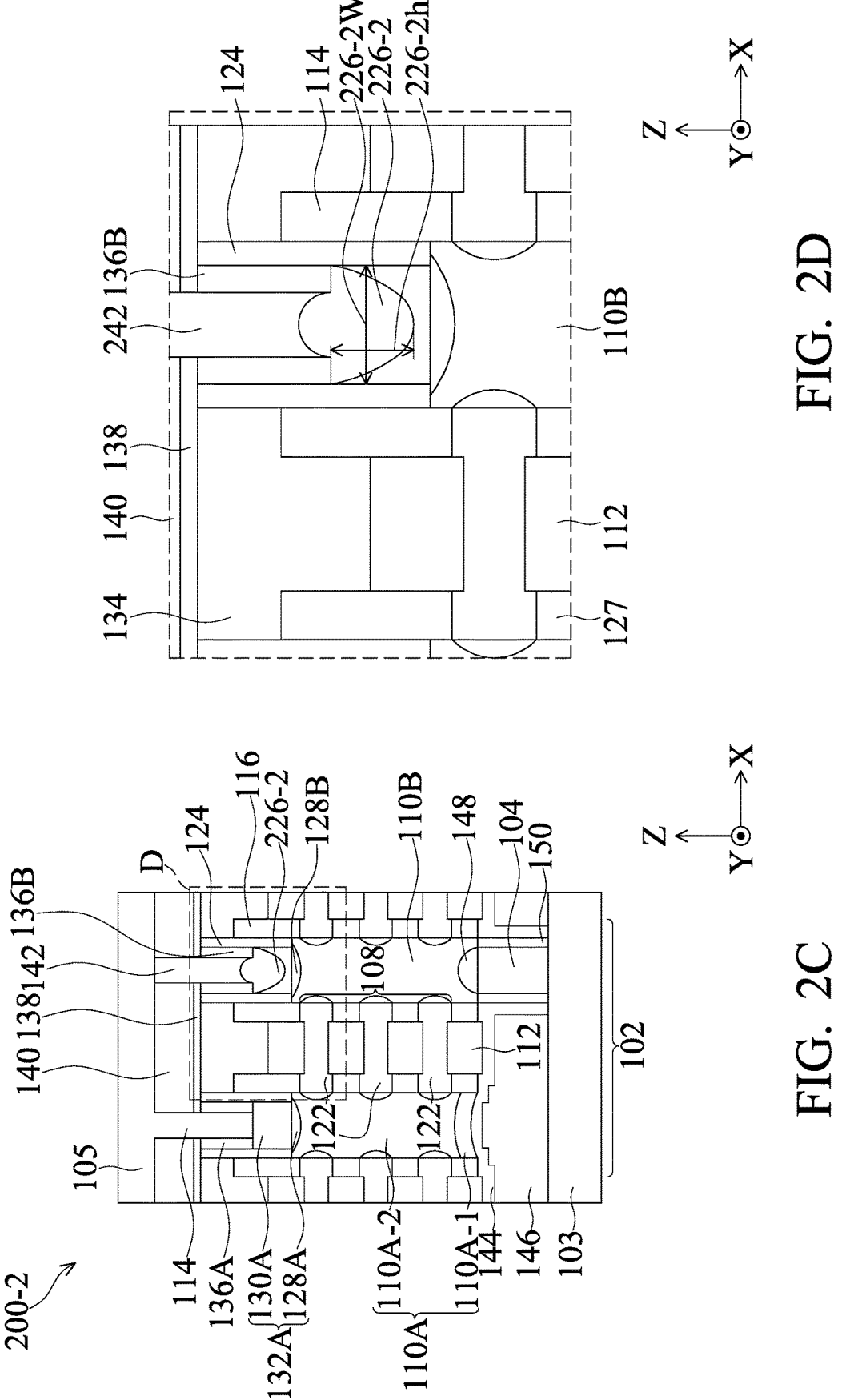

FIG. 2A illustrates a cross-sectional view of a BPR semiconductor device 200-1 with capacitance reduction using an air gap 226-1, in accordance with some embodiments. FIG. 2B illustrates an enlarged view of region B in FIG. 2A, in accordance with some embodiments. FIG. 2C illustrates a cross-sectional view of a BPR semiconductor device 200-2 with capacitance reduction using an air gap 226-2, in accordance with some embodiments. FIG. 2D illustrates an enlarged view of region D in FIG. 2C, in accordance with some embodiments. Elements in FIGS. 2A-2D with the same annotations as elements in FIGS. 1A-1C are described above.

As shown in FIGS. 2A-2B, BPR semiconductor device 200-1 can include no dummy silicide layers on second S/D region 110B. Because of the absence of dummy silicide layers, air gap 226-1 can have increased dimensions and the parasitic capacitance between gate structures 112 and second S/D region 110B can be further reduced. In some embodiments, air gap 226-1 can have a horizontal dimension 226-1w (e.g., width) along an X-axis ranging from about 5 nm to about 30 nm. Air gap 226-1 can have a vertical dimension 226-1h (e.g., height) along a Z-axis ranging from about 10 nm to about 50 nm. In some embodiments, a ratio between vertical dimension 226-1h to horizontal dimension 226-1w can range from about 0.1 to about 10.

As shown in FIGS. 2C-2D, BPR semiconductor device 200-2 can have a seal dielectric layer 242 disposed on second S/D region 110B in air gap 226-2. Seal dielectric layer 242 can be formed on the surfaces of second S/D region 110B and first ESL 124 during the deposition of seal dielectric structure 142. In some embodiments, seal dielectric layer 242 can have a thicker thickness at bottom corners in air gap 226-2. Because forming seal dielectric layer 242, air gap 226-2 can have reduced dimensions and the parasitic capacitance between gate structures 112 and second S/D region 110B can increase. In some embodiments, air gap 226-2 can have a horizontal dimension 226-2w (e.g., width) along an X-axis ranging from about 5 nm to about 20 nm. Air gap 226-2 can have a vertical dimension 226-2h (e.g., height) along a Z-axis ranging from about 5 nm to about 40 nm. In some embodiments, a ratio between vertical dimension 226-1h to horizontal dimension 226-1w can range from about 0.2 to about 8. In some embodiments, BPR semiconductor device 200-1 including no dummy silicide layers can have a seal dielectric layer in air gap 226-1 (not shown) formed during the fabrication processes. The seal dielectric layer in air gap 226-1 can also reduce dimensions of air gap 226-1 and increase the parasitic capacitance between gate structures 112 and second S/D region 110B.

FIG. 3 is a flow diagram of a method 300 for fabricating BPR semiconductor device 100 with capacitance reduction using air gap 126, in accordance with some embodiments. Method 300 may not be limited to GAA FETs and can be applicable to devices that would benefit from capacitance reduction using an air gap, such as planar FETs, fin FETs, etc. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations. For example purposes, the operations illustrated in FIG. 3 will be described with reference to the example fabrication process for fabricating BPR semiconductor device 100 as illustrated in FIGS. 4-13. FIGS. 4-13 are cross-sectional views of BPR semiconductor device 100. Although FIGS. 4-13 illustrate fabrication processes of BPR semiconductor device 100 with capacitance reduction using air gap 126 in FET 102, method 300 can be applied to other FETs in BPR semiconductor device 100, BPR semiconductor devices 200-1 and 200-2, and other BPR semiconductor devices. Elements in FIGS. 4-13 with the same annotations as elements in FIGS. 1A-1C are described above.

Figure 4:
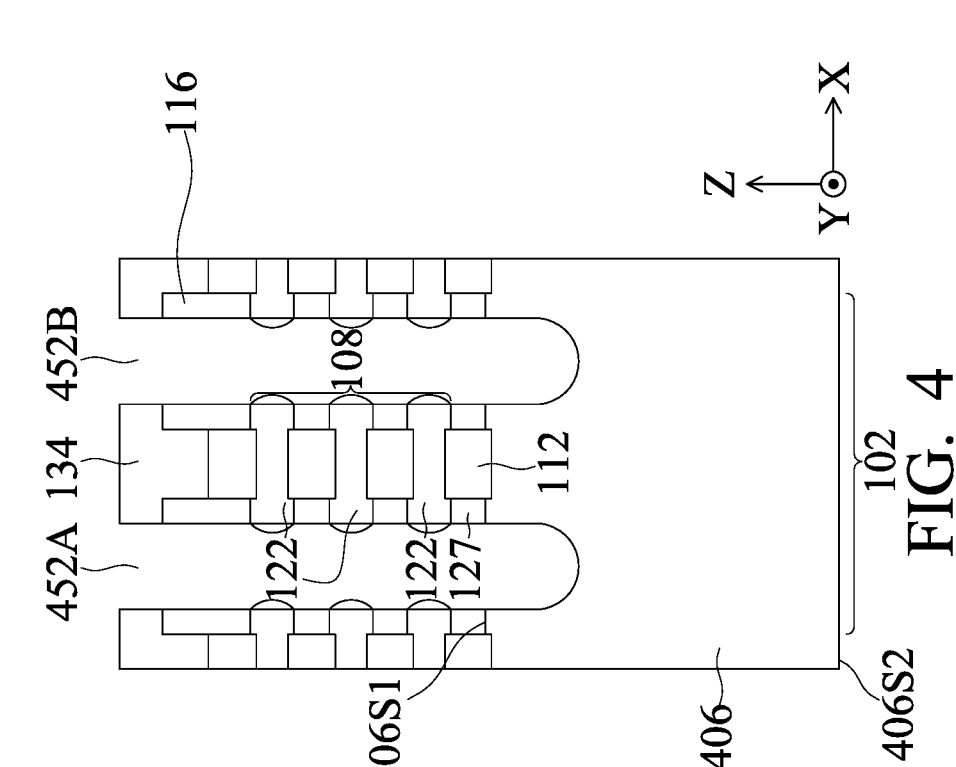

In referring to FIG. 3, method 300 begins with operation 310 of forming a fin structure on a first side of a substrate. For example, as shown in FIG. 4, fin structure 108 can be formed on a first side 406S1 of substrate 406. In some embodiments, substrate 406 can be Si. Fin structure 108 can include semiconductor layers 122. In some embodiments, semiconductor layers 122 can include Si. Gate structures 112 can wrap around each of semiconductor layers 122. Gate spacers 116 can be formed on sidewalls of gate structures 112 above fin structure 108. Inner spacer structures 127 can be formed adjacent to gate structures 112 and between semiconductor layers 122. Gate capping structure 134 can be formed on gate structures 112 to protect gate structures 112.

The formation of fin structure 108 can include epitaxially growing semiconductor layers having different etch selectivity in an alternating configuration. The alternating semiconductor layers can be removed and inner spacer structures 127 and gate structures 112 can be formed between semiconductor layers 122. The formation of fin structure 108 can be followed by a vertical etch to form openings 452A and 452B adjacent to opposite ends of fin structure 108.

Figure 5:
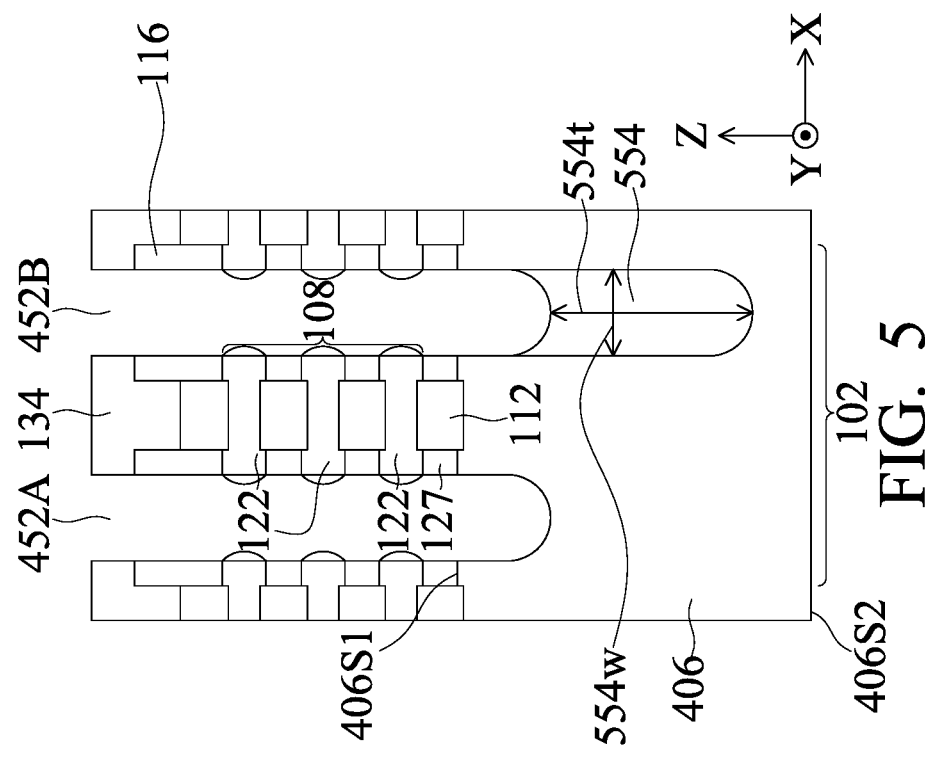
FIGS. 4-13 illustrate cross-sectional views of a BPR semiconductor device with capacitance reduction using an air gap at various stages of its fabrication process, in accordance with some embodiments.
Figures 6, 7:
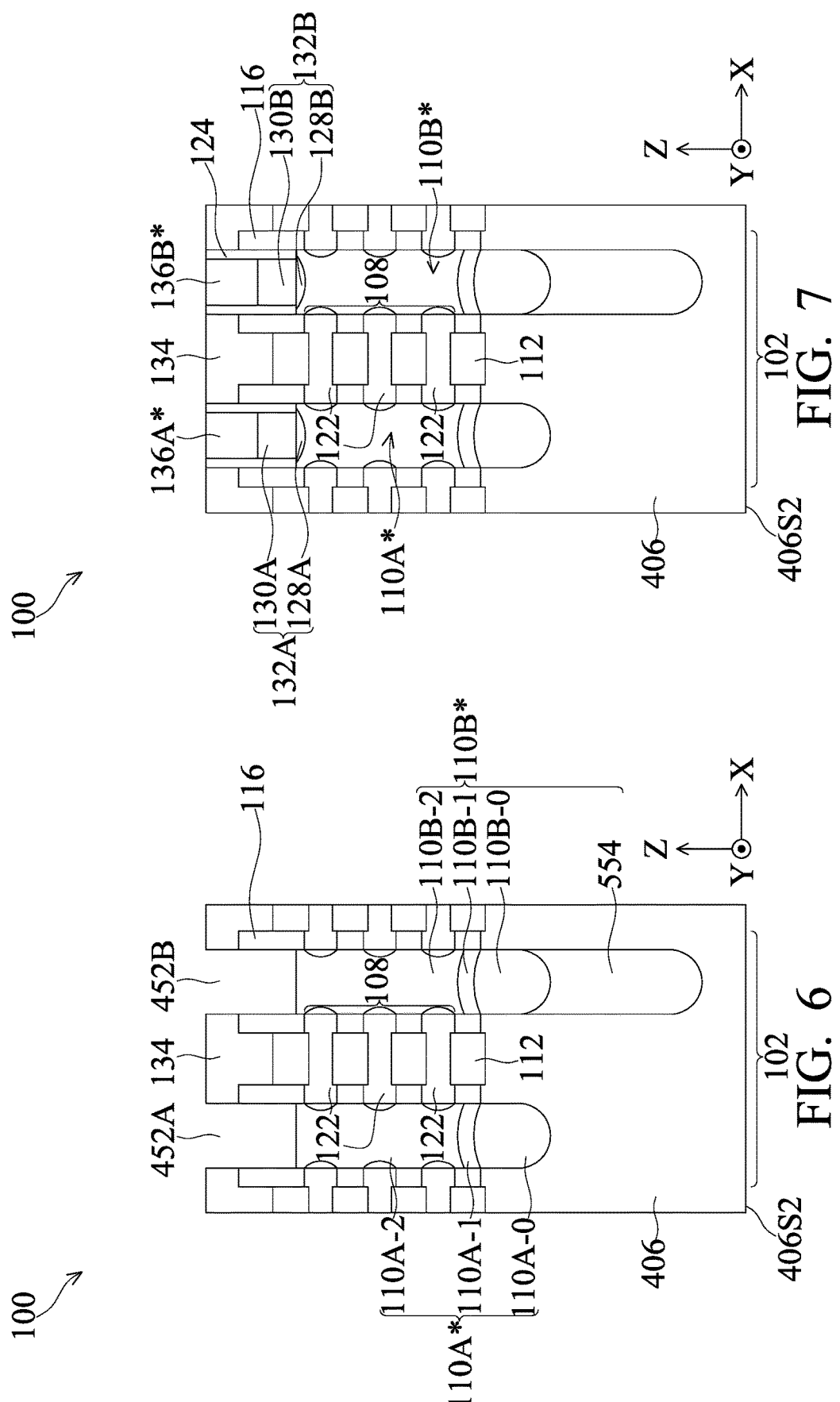

In operation 320 of FIG. 3, first and second source/drain (S/D) regions can be formed adjacent to opposite ends of the fin structure. For example, as shown in FIGS. 5 and 6, first and second S/D regions 110A* and 110B* can be formed in openings 452A and 452B, respectively, adjacent to opposite ends of fin structure 108 on first side 406S1 of substrate 406. In some embodiments, dummy epitaxial layers can be formed in openings 452A and 452B for backside connections to second S/D region 110B*.

Prior to forming first and second S/D regions 110A* and 110B*, opening 452B can be etched with opening 452A blocked by a mask layer and a first dummy epitaxial layer 554 can be epitaxially grown in opening 452B extending into substrate 406. In some embodiments, first dummy epitaxial layer 554 can have a width 554w along an X-axis ranging from about 10 nm to about 30 nm and a thickness 554t along a Z-axis ranging from about 20 nm to about 50 nm. In some embodiments, first dummy epitaxial layer 554 can include silicon germanium (SiGe) with Ge in a range from about 5 atomic percent to about 15 atomic percent with any remaining atomic percent being Si. In some embodiments, first dummy epitaxial layer can be replaced by backside interconnect structures in subsequent processes.

The formation of first dummy epitaxial layer 554 can be followed by epitaxial growth of second dummy epitaxial layers 110A-0 and 110B-0 in openings 452A and 452B, respectively. In some embodiments, second dummy epitaxial layers 110A-0 and 110B-0 can include SiGe with Ge in a range from about 20 atomic percent to about 35 atomic percent with any remaining atomic percent being Si. In some embodiments, second dummy epitaxial layers 110A-0 and 110B-0 can have a width along an X-axis ranging from about 10 nm to about 30 nm and a thickness along a Z-axis ranging from about 5 nm to about 10 nm. In some embodiments, second dummy epitaxial layers 110A-0 and 110B-0 can protect first and second S/D regions 110A and 110B during subsequent processes of substrate 406 removal.

First epitaxial sub-regions 110A-1 and 110B-1 and second epitaxial sub-regions 110A-2 and 110B-2 can be epitaxially grown on second dummy epitaxial layers 110A-0 and 110B-0, respectively. In some embodiments, first epitaxial sub-regions 110A-1 and 110B-1 can have a width along an X-axis ranging from about 10 nm to about 30 nm and a thickness along a Z-axis ranging from about 5 nm to about 10 nm. In some embodiments, second epitaxial sub-regions 110A-2 and 110B-2 can have a width along an X-axis ranging from about 10 nm to about 30 nm and a thickness along a Z-axis ranging from about 30 nm to about 50 nm. In some embodiments, first epitaxial sub-regions 110A-1 and 110B-1 and second epitaxial sub-regions 110A-2 and 110B-2 can include SiGe and can be in-situ doped using p-type dopants for p-type first and second S/D regions 110A and 110B. In some embodiments, first epitaxial sub-regions 110A-1 and 110B-1 and second epitaxial sub-regions 110A-2 and 110B-2 can include Si and can be in-situ doped using n-type dopants for n-type first and second S/D regions 110A and 110B.

After forming the dummy epitaxial layers and the epitaxial sub-regions, first S/D region 110A can include second dummy epitaxial layer 110A-0, first epitaxial sub-region 110A-1, and second epitaxial sub-region 110A-2. Second S/D region 110B can include first dummy epitaxial layer 554, second dummy epitaxial layer 110B-0, first epitaxial sub-region 110B-1, and second epitaxial sub-region 110B-2.

In operation 330 of FIG. 3, a first S/D contact structure can be formed in contact with the first S/D region, and a second S/D contact structure can be formed in contact with the second S/D region. For example, as shown in FIG. 7, first S/D contact structure 132A (also referred to as "front-side S/D contact structure 132A") can be formed in opening 452A shown in FIG. 6 and in contact with first S/D region 110A*. Second S/D contact structure 132B (also referred to as "dummy S/D contact structure 132B") can be formed in opening 452B shown in FIG. 6 and in contact with second S/D region 110B*. Prior to forming first and second S/D contact structures 132A and 132B, first ESL 124 can be formed to protect gate structure 112 and/or portions of first and second S/D regions 110A and 110B that are not in contact with first and second S/D contact structures 132A and 132B.

The formation of first and second S/D contact structures 132A and 132B can include removal of a portion of first ESL 124 on first and second S/D regions 110A and 110B, formation of silicide layers 128A and 128B, and deposition of metals in openings 452A and 452B followed by a chemical mechanical polishing (CMP) process to coplanarize top surfaces of gate capping structure 134 and first and second S/D contact structures 132A and 132B. First S/D contact structure 132A can include silicide layer 128A and metal contact 130A and can be connected to an interconnect structure in subsequent processes. Second S/D contact structure 132B can include silicide layer 128B and metal contact 130B and may not connect to any interconnect structures. As a result, second S/D contact structure 132B can be referred to as "dummy S/D contact structure 132B," silicide layer 128B can be referred to as "dummy silicide layer 128B," and metal contact 130B can be referred to as "dummy metal contact 130B." In some embodiments, silicide layer 128A and dummy silicide layer 128B can include same metal silicides and metal contact 130A and dummy metal contact 130B can include same metals.

In operation 340 of FIG. 3, a first capping structure can be formed on the first S/D contact structure and a second capping structure can be formed on the second S/D contact structure. For example, as shown in FIG. 7, first capping structure 136A* can be formed on first S/D contact structure 132A and second capping structure 136B* can be formed on second S/D contact structure 132B. First and second S/D contact structures 132A and 132B can be etched back. Capping dielectric materials can be deposited on first and second S/D contact structures 132A and 132B followed by a CMP process to coplanarize top surfaces of gate capping structure 134 and first and second capping structures 136A* and 136B*. In some embodiments, first and second capping structures 136A* and 136B* can have a thickness along a Z-axis ranging from about 0 nm to about 50 nm and a width along an X-axis ranging from about 5 nm to about 30 nm. In some embodiments, BPR semiconductor device 100 can have no capping structures on front-side S/D contact structure 132A.

Figure 9:
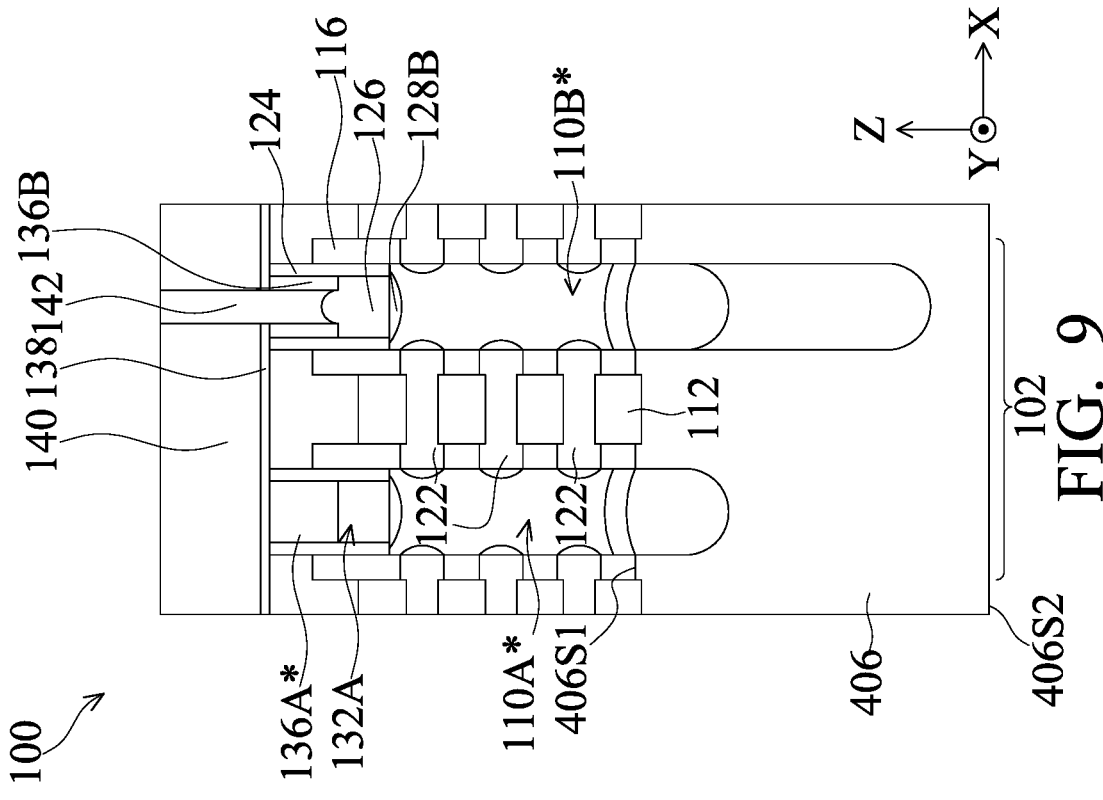
Figure 8:
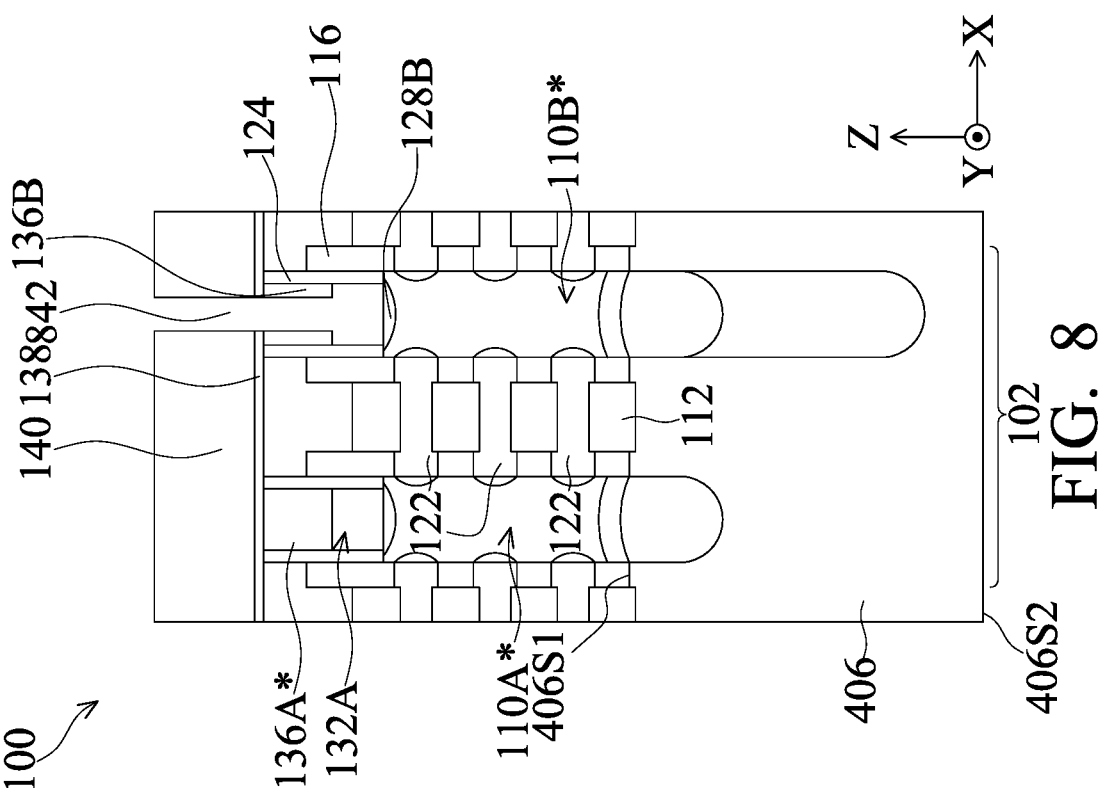

In operation 350 of FIG. 3, a portion of the second S/D contact structure can be removed through the second capping structure to form an air gap. For example, as shown in FIGS. 8 and 9, a portion of second S/D contact structure 132B can be removed through second capping structure 136B* to form air gap 126. The removal of the portion of second S/D contact structure 132B can include forming opening 842 in second capping structure 136B*, etching the portion of second S/D contact structure 132B, and forming seal dielectric structure 142 in opening 842. Prior to forming opening 842, second ESL 138 and front-side ILD layer 140 can be blanket deposited on top surfaces of gate capping structure 134 and first and second capping structures 136A* and 136B*, as shown in FIG. 8.

The blanket depositions of second ESL 138 and front-side ILD layer 140 can be followed by forming opening 842 by a patterning process. A mask layer can be deposited on front-side ILD layer 140 to open areas over second S/D region 110B for an etching process. Front-side ILD layer 140, second ESL 138, and second capping structure 136B* can be etched to form opening 842. In some embodiments, the etching process can include multiple steps, in which each step can remove one of front-side ILD layer 140, second ESL 138, and second capping structure 136B. In some embodiments, the etching process can stop on dummy metal contact 130B. In some embodiments, opening 842 can have a width along an X-axis ranging from about 5 nm to about 15 nm.

The formation of opening 842 can be followed by the etching of the portion of second S/D contact structure 132B to form air gap 126. As shown in FIG. 8, dummy metal contact 130B of second S/D contact structure 132B can be etched and removed through opening 842. In some embodiments, dummy metal contact 130B can be removed by a wet etching process. In some embodiments, the wet etching process can include etchants of sulfuric acid ($H_2SO_4$), hydrochloric acid (HCl), and hydrogen peroxide ($H_2O_2$) at various concentrations. In some embodiments, the wet etching process can be performed at a temperature ranging from about 25° C. to about 125° C. In some embodiments, the wet etching process can remove dummy metal contact 130B and keep dummy silicide layer 128B, as shown in FIGS. 1A-1C and 8. In some embodiments, the wet etching process can remove both dummy metal contact 130B and dummy silicide layer 128B, which are shown in FIGS. 2A and 2B.

The etching of the portion of second S/D contact structure 132B to form air gap 126 can be followed by forming seal dielectric structure 142 in opening 842. As shown in FIG. 9, seal dielectric structure 142 can be formed in opening 842 shown in FIG. 8 to seal air gap 126. In some embodiments, seal dielectric structure 142 can be formed by depositing a seal dielectric material in opening 842 by atomic layer deposition (ALD) or other suitable deposition methods. The seal dielectric materials can include insulating materials, such as silicon oxide ($SiO_x$), silicon oxycarbide (SiOC), aluminum oxide ($AlO_x$), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride ($SiN_x$), silicon oxynitricarbide (SiOCN), zirconium nitride (ZrN), silicon carbonitride (SiCN), and other suitable materials. In some embodiments, the seal dielectric material can be deposited at a temperature ranging from about 100° C. to about 400° C. In some embodiments, the seal dielectric material can be deposited using precursors including silane ($SiH_4$) and other suitable precursors. The seal dielectric material can be deposited at a deposition rate ranging from about 10 Å/min to about 100 Å/min for about 5 deposition cycles to about 30 deposition cycles. In some embodiments, the deposition process can form seal dielectric structure 142 in opening 842, as shown in FIGS. 1A-1C and 9. In some embodiments, the seal dielectric material can be deposited on sidewalls in opening 842 and can merge at the middle of opening 842, thereby forming a concave surface adjacent to air gap 126. In some embodiments, the deposition process can deposit a layer of the seal dielectric material in air gap 126 before sealing opening 842, therefore forming seal dielectric structure 142 in opening 842 and seal dielectric layer 242 in air gap 126 as shown in FIGS. 2C and 2D. The deposition of seal dielectric structure 142 can be followed by a CMP process to coplanarize top surfaces of front-side ILD layer 140 and seal dielectric structure 142.

Figures 10, 11:
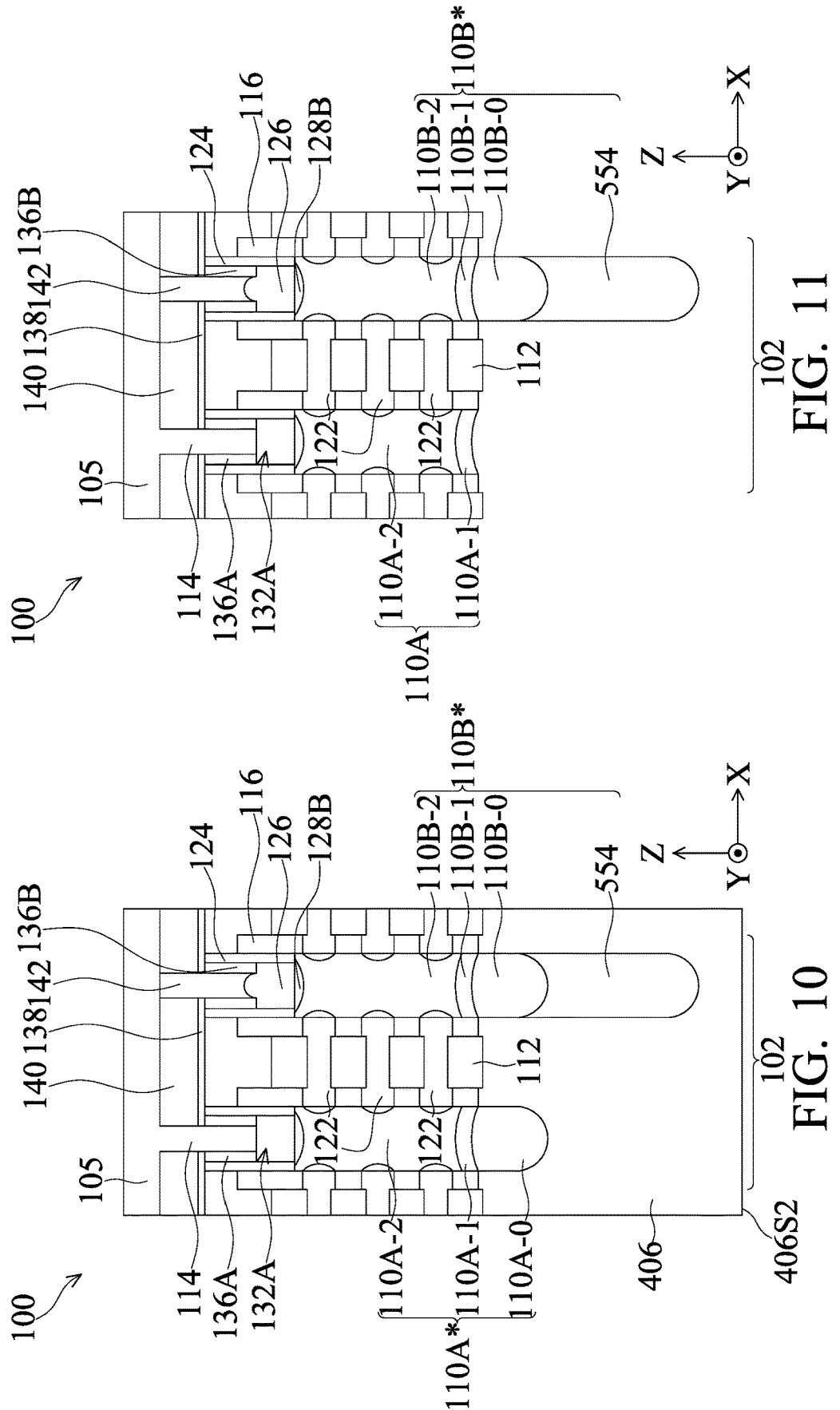

The formation of seal dielectric structure 142 can be followed the formation of front-side interconnect structure 114 and front-side power rails 105. As shown in FIG. 10, front-side interconnect structure 114 can be formed in first capping structure 136A to connect to front-side S/D contact structure 132A. The formation of front-side interconnect structure 114 can include a patterning process to form an opening in front-side ILD layer 140, second ESL 138, and first capping structure 136A, similar to the patterning process to form opening 842. Metals can be deposited into the opening to form front-side interconnect structure 114.

Figures 12, 13:
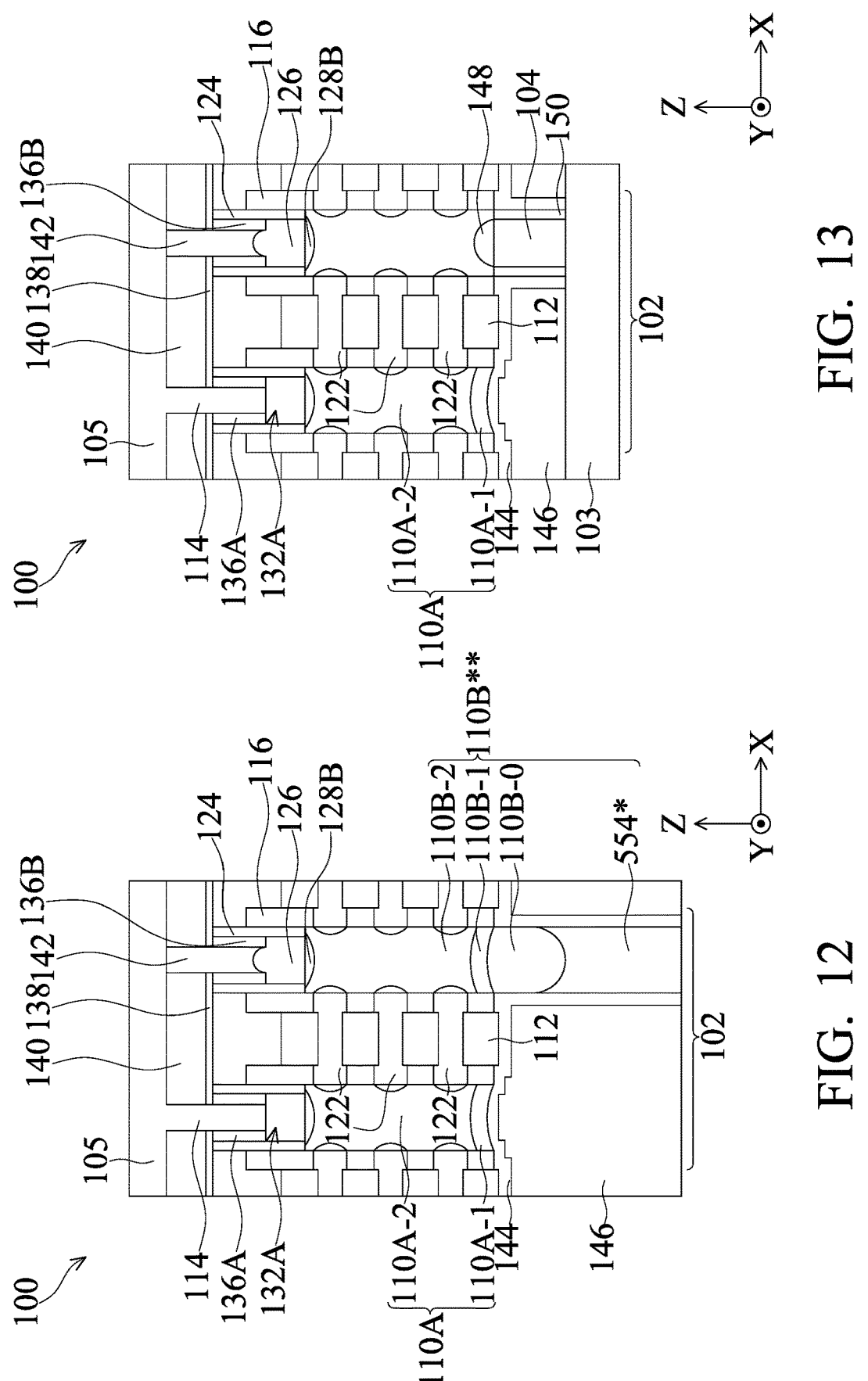

In operation 360 of FIG. 3, a third contact structure is formed on a second side of the substrate in contact with the second S/D region. The second side is opposite to the first side. For example, as shown in FIGS. 11-13, third contact structure 148 can be formed on second side (e.g., backside) 406S2 of substrate 406 (also referred to as "backside contact structure 148"). Second side 406S2 can be opposite to first side 406S1. Prior to forming backside contact structure 148, BPR semiconductor device 100 can be bonded to a carrier substrate (not shown) on first side 406S1 (e.g., front-side) of substrate 406 for subsequent fabrication processes on second side 406S2 of substrate 406.

The bonding of BPR semiconductor device 100 to the carrier substrate can be followed by a removal of substrate 406 by an etching process, as shown in FIG. 11. In some embodiments, the etching process can include a dry etching process using etchants including chlorine ($Cl_2$), boron chloride ($BCl_3$), and oxygen ($O_2$). A flow rate of the etchants can range from about 5 sccm to about 200 sccm. The dry etching process can be performed at a pressure ranging from about 1 mTorr to about 100 mTorr with a plasma power ranging from about 50 W to about 250 W. The removal of substrate 406 can be followed by removal of second dummy epitaxial layer 110A-0 as shown in FIG. 11. In some embodiments, first dummy epitaxial layer 554 and second dummy epitaxial layer 110B-0 may not be removed during the removal of substrate 406 and second dummy epitaxial layer 110A-0 due to different etch rates. For example, during the removal of substrate 406 including silicon, first dummy epitaxial layer 554 and second dummy epitaxial layer 110A-0 may include silicon germanium having a lower etch rate and may not be removed. During the removal of second dummy epitaxial layer 110A-0, first dummy epitaxial layer 554 may include silicon germanium with a different germanium concentration and have a different etch rate, thereby protecting second dummy epitaxial layer 110B-0.

The removal of substrate 406 and second dummy epitaxial layer 110A-0 can be followed by the deposition of liner 144 and backside ILD layer 146, as shown in FIG. 12. In some embodiments, liner 144 can provide protection to gate structures 112 and first and second S/D regions 110A and 110B** during formation of backside ILD layer 140. In some embodiments, backside ILD layer 146 can be deposited using a deposition method suitable for flowable dielectric materials. In some embodiments, backside ILD layer 146 can include flowable silicon oxide, flowable silicon nitride, flowable silicon oxynitride, flowable silicon carbide, or flowable silicon oxycarbide. In some embodiments backside ILD layer 146 can isolate backside interconnect structure 104 of FET 102 from other adjacent devices and structures.

The deposition of liner 144 and backside ILD layer 146 can be followed by the removal of first dummy epitaxial layer 554 and second dummy epitaxial layer 110B-0. For p-type first and second epitaxial sub-regions 110B-1 and 110B-2, the removal of first dummy epitaxial layer 554 and second dummy epitaxial layer 110B-0 may have an over etch of first epitaxial sub-region 110B-1 and may remove first epitaxial sub-region 110B-1 due to similar etch selectivity between second dummy epitaxial layer 110B-0 and p-type first epitaxial sub-region 110B-1. For n-type first and second epitaxial sub-regions 110B-1 and 110B-2, the removal of first dummy epitaxial layer 554 and second dummy epitaxial layer 110B-0 may stop on first epitaxial sub-region 110B-1 due to higher etch selectivity between second dummy epitaxial layer 110B-0 and n-type first epitaxial sub-region 110B-1.

The removal of first dummy epitaxial layer 554 and second dummy epitaxial layer 110B-0 can be followed by the formation of third contact structure 148 on second side 406S2 (also referred to as "backside contact structure 148"), as shown in FIG. 13. In some embodiments, backside contact structure 148 can include a silicide layer formed with a metal silicide the same as or different from silicide layers 128A and 128B. In some embodiments, backside contact structure 148 can reduce the contact resistance between second S/D region 110B and backside interconnect structure 104. The formation of backside contact structure 148 can be followed by formation of barrier layer 150, backside interconnect structure 104, and backside power rails 103.

Various embodiments in the present disclosure provide methods for forming BPR semiconductor devices 100, 200-1, and 200-2 with capacitance reduction using air gaps 126, 226-1, and 226-2, respectively. According to some embodiments, BPR semiconductor device 100 can have first and second S/D regions 110A and 110B adjacent to opposite ends of fin structure 108 on front side 406S2 of substrate 406. First and second S/D contact structures 132A and 132B having respective metal contacts 130A and 130B and silicide layers 128A and 128B can be formed in contact with first and second S/D regions 110A and 110B, respectively. First S/D contact structure 132A can be connected to front-side power rails 105 by first interconnect structure 114 through first capping structure 136A. Second S/D contact structure 132B can be removed through opening 842 in second capping structure 136B. After removal of the second S/D contact structure, an air gap can form between the second capping structure and the second S/D region. In some embodiments, both metal contact 130B of second S/D contact structure 132B can be removed through opening 842. In some embodiments, metal contact 130B and silicide layer 128B of second S/D contact structure 132B can be removed through opening 842. In some embodiments, seal dielectric structure 142 can be formed in opening 842 to seal air gap 126 between second capping structure 136B and second S/D region 110B. In some embodiments, seal dielectric layer 242 can be formed in air gap 226-2 during the formation of seal dielectric structure 142. According to some embodiments, air gap 126 can reduce the parasitic capacitance between second S/D region 110B and gate structures 112 of BPR semiconductor device 100. In some embodiments, the device performance of BPR semiconductor device 100 can be improved by about 3% to about 5.5% due to capacitance reduction using air gap 126.

In some embodiments, a method includes forming a fin structure on a first side of a substrate, forming a source/drain (S/D) region adjacent to the fin structure, forming a first S/D contact structure on the first side of the substrate and in contact with the S/D region, and forming a capping structure on the first S/D contact structure. The methods further includes removing a portion of the first S/D contact structure through the capping structure to form an air gap and forming a second S/D contact structure on a second side of the substrate and in contact with the S/D region. The second side is opposite to the first side.

In some embodiments, a method includes forming a fin structure on a first side of a substrate, forming first and second source/drain (S/D) regions adjacent to opposite ends of the fin structure, and forming a first S/D contact structure in contact with the first S/D region and a second S/D contact structure in contact with the second S/D region on the first side of the substrate. The method further includes removing a portion of the second contact structure through the second capping structure to form an air gap and forming a third contact structure on a second side of the substrate and in contact with the second S/D region. The second side is opposite to the first side.

In some embodiments, a semiconductor device includes a fin structure on a first side of a substrate, first and second source/drain (S/D) regions adjacent to opposite ends of the fin structure, a first S/D contact structure in contact with the first S/D region, a first capping structure on the first contact structure, a second capping structure over the second S/D region, an air gap between the second capping structure and the second S/D region, and a second S/D contact structure in contact with the second S/D region on a second side of the substrate. The second side is opposite to the first side.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an epitaxial structure;
a dielectric structure on a first side of the epitaxial structure;
an air gap between the epitaxial structure and the dielectric structure, wherein the air gap is in contact with the dielectric structure; and
a contact structure in contact with a second side of the epitaxial structure, wherein the second side is opposite to the first side.

2. The semiconductor device of claim 1, wherein the air gap is in contact with the first side of the epitaxial structure.

3. The semiconductor device of claim 1, further comprising a silicide layer on the first side of the epitaxial structure, wherein the silicide layer is between the air gap and the epitaxial structure.

4. The semiconductor device of claim 3, further comprising a layer of dielectric material in contact with the silicide layer, wherein the air gap is between the layer of dielectric material and the dielectric structure.

5. The semiconductor device of claim 1, further comprising a seal structure on the first side of the epitaxial structure, wherein the seal structure, the dielectric structure, and the epitaxial structure enclose the air gap.

6. The semiconductor device of claim 1, further comprising an interconnect structure on the second side of the epitaxial structure and in contact with the contact structure.

7. The semiconductor device of claim 1, wherein the contact structure comprises a silicide layer.

8. A semiconductor device, comprising:
first and second source/drain (S/D) regions in contact with opposite ends of a channel structure;
a first contact structure in contact with the first S/D region;
a capping structure above the second S/D region;
an air gap between the capping structure and the second S/D region;
a dielectric structure above the air gap and extending through the capping structure, wherein the air gap is in contact with bottom surfaces of the dielectric structure and the capping structure; and
a second contact structure in contact with the second S/D region and on a side of the second S/D region vertically opposite to the air gap.

9. The semiconductor device of claim 8, further comprising a silicide layer on the second S/D region and in contact with the air gap.

10. The semiconductor device of claim 8, wherein the dielectric structure, the capping structure, and the second S/D region enclose the air gap.

11. The semiconductor device of claim 8, further comprising a seal dielectric layer, wherein the seal dielectric layer is on the second S/D region.

12. The semiconductor device of claim 8, wherein the air gap is in contact with the second S/D region.

13. The semiconductor device of claim 8, wherein the second contact structure comprises a silicide layer in contact with the second S/D region.

14. The semiconductor device of claim 8, further comprising:
a first interconnect structure in contact with the first contact structure; and
a second interconnect structure in contact with the second contact structure.

15. A method, comprising:
forming a source/drain (S/D) region on a substrate;
forming a contact structure on the S/D region;
forming a dielectric structure on the contact structure; and
removing at least a portion of the contact structure through the dielectric structure to form an air gap between the dielectric structure and the S/D region.

16. The method of claim 15, wherein the removing at least the portion of the contact structure comprises:
forming an opening in the dielectric structure;
removing the contact structure through the opening to form the air gap; and
forming a seal structure in the opening to seal the air gap.

17. The method of claim 16, wherein the forming the seal structure comprises depositing a dielectric material on the dielectric structure to seal the opening.

18. The method of claim 15, wherein the contact structure comprises a metal contact and a silicide layer, and wherein the removing at least the portion of the contact structure comprises:
forming an opening in the dielectric structure;
removing the metal contact through the opening to form the air gap; and
forming a seal structure in the opening to seal the air gap, wherein the air gap is in contact with the silicide layer.

19. The method of claim 15, further comprising:
removing a portion of the S/D region on a side of the S/D region opposite to the air gap; and
forming an additional contact structure in contact with the side of the S/D region opposite to the air gap.

20. The method of claim 19, further comprising forming an interconnect structure in contact with the additional contact structure.

* * * * *